Aug. 4, 1970 L. H. RAGAN 3,522,556

VARIABLE ATTENUATOR

Filed Oct. 23, 1965 2 Sheets-Sheet 1

INVENTOR.
LAWRENCE H. RAGAN

BY John F. Lawler
ATTORNEY

Aug. 4, 1970 L. H. RAGAN 3,522,556

VARIABLE ATTENUATOR

Filed Oct. 23, 1965 2 Sheets-Sheet 2

INVENTOR.
LAWRENCE H. RAGAN

BY John F. Lawler
ATTORNEY

United States Patent Office 3,522,556

Patented Aug. 4, 1970

3,522,556
VARIABLE ATTENUATOR

Lawrence H. Ragan, Mountain View, Calif., assignor to Sylvania Electric Products Inc., a corporation of Delaware Filed Oct. 23, 1965, Ser. No. 503,522
Int. Cl. H01p *1/22, 5/12*
U.S. Cl. 333—9 3 Claims

ABSTRACT OF THE DISCLOSURE

This network provides for variable attenuation of an input signal having a prescribed frequency while maintaining the input impedance of the network constant. The network includes a first shunt resonant circuit comprising an inductor and a first varactor diode having an impedance Z connected between input and output terminals; a first load having a predetermined impedance $Z_0$ connected between the output terminal and ground; and a bypass circuit. The bypass circuit includes a $\lambda/4$ transmission line impedance inverter having a characteristic impedance $Z_0$ connected to the input terminal; a second shunt resonant circuit comprising an inductor and a second varactor diode having an impedance Z connected between the output of the impedance inverter and ground; and a differential phase shifter network connected between the output of the inverter and the output terminal and having an input impedance $Z_0$ in parallel with the second diode. The impedances of the diodes are varied to change the attenuation of the network. The differential phase shifter network adjusts the phase of signal currents in the bypass circuit to be 180° out-of-phase with the output current of the first diode to cancel the signal in the load to increase the maximum attenuation of the network.

This invention relates to radio frequency attenuators, and more particularly to a remotely controlled variable attenuator having a constant input impedance. The invention is specifically concerned with circuit improvements for increasing the attenuation achievable with the attenuator disclosed in patent application Ser. No. 452,794, filed May 3, 1965, now Pat. 3,416,101, by Johannes Van Sandwyk and assigned to the assignee of this invention.

The above-identified Van Sandwyk variable attenuator is illustrated in FIG. 1, and comprises a series circuit 1 having a first variable impedance element 2 connected between an input terminal 3 and an output terminal 4 and in series with an output load 9 having a predetermined impedance $Z_0$. A bypass circuit 5 comprising a second variable impedance element 11, connected in parallel with a load 12 having the predetermined impedance, is connected to a reference potential such as ground and through an impedance inverter 10 to input terminal 3. The impedance inverter transforms the output impedance $Z_{out}$ thereof to the input impedance $Z_2=1/Y_2$ thereof according to the relationship $Z_2Z_{out}=Z_0^2$, where $Z_0$ is the characteristic impedance thereof. The variable impedance elements are selected so that their impedance response characteristics are substantially identical. The attenuation of the network is controlled by simultaneous equal change of the impedances of these elements in the same sense so that their impedances remain equal. In order that an input signal is passed to output terminal 4 with minimum attenuation, the elements are simultaneously adjusted to have a minimum impedance. The low impedance of element 11 is transformed to a large impedance at terminal 3 by inverter 10 to block the input signal from bypass circuit 5. Maximum attenuation of the input signal is provided by simultaneous adjustment of the elements for maximum impedances. The resultant impedance of the element 11 and load 12 is transformed by inverter 10 to an impedance at terminal 3 such that the bypass circuit is matched to the input and the input signal is passed to load 12. The characteristics of inverter 10 are chosen so that with the network terminated in the predetermined impedance, the input impedance of the network is constant, is equal to the predetermined impedance, and is independent of the impedances of the elements 2 and 11. Experimental investigation reveals that the maximum attenuation of the network when the elements 2 and 11 are varactor diodes is approximately 12.5 db. The maximum attenuation when elements 2 and 11 are parallel resonant circuits is approximately 28 db.

An object of this invention is the provision of a variable attenuator having high attenuation and low insertion loss.

Another object is to increase the maximum attenuation of the foregoing Van Sandwyk variable attenuator.

The foregoing objects are accomplished in accordance with this invention by provision of circuit means which attenuates the output of the impedance inverter, adjusts the phase of the current associated with the attenuated signal to be 180° out-of-phase with the output current of the first variable impedance element and applies the phase adjusted signal current to the output load impedance in order to cancel the portion of the input signal current coupled directly thereto.

This invention and these and other of its objects will be more fully understood from the following description of embodiments thereof in conjunction with the accompanying drawings in which.

Figure 1:
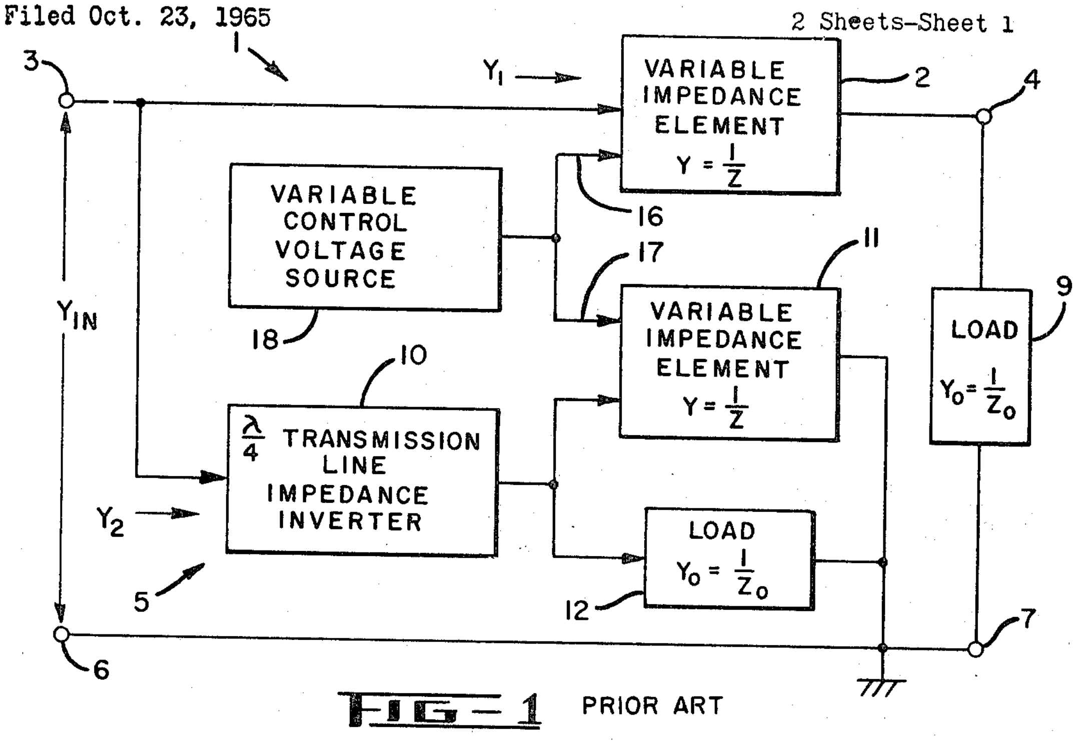
FIG-1 PRIOR ART
FIG. 1 is the schematic block diagram of the above-identified Van Sandwyk variable attenuator to which reference has already been made.
Figure 2:
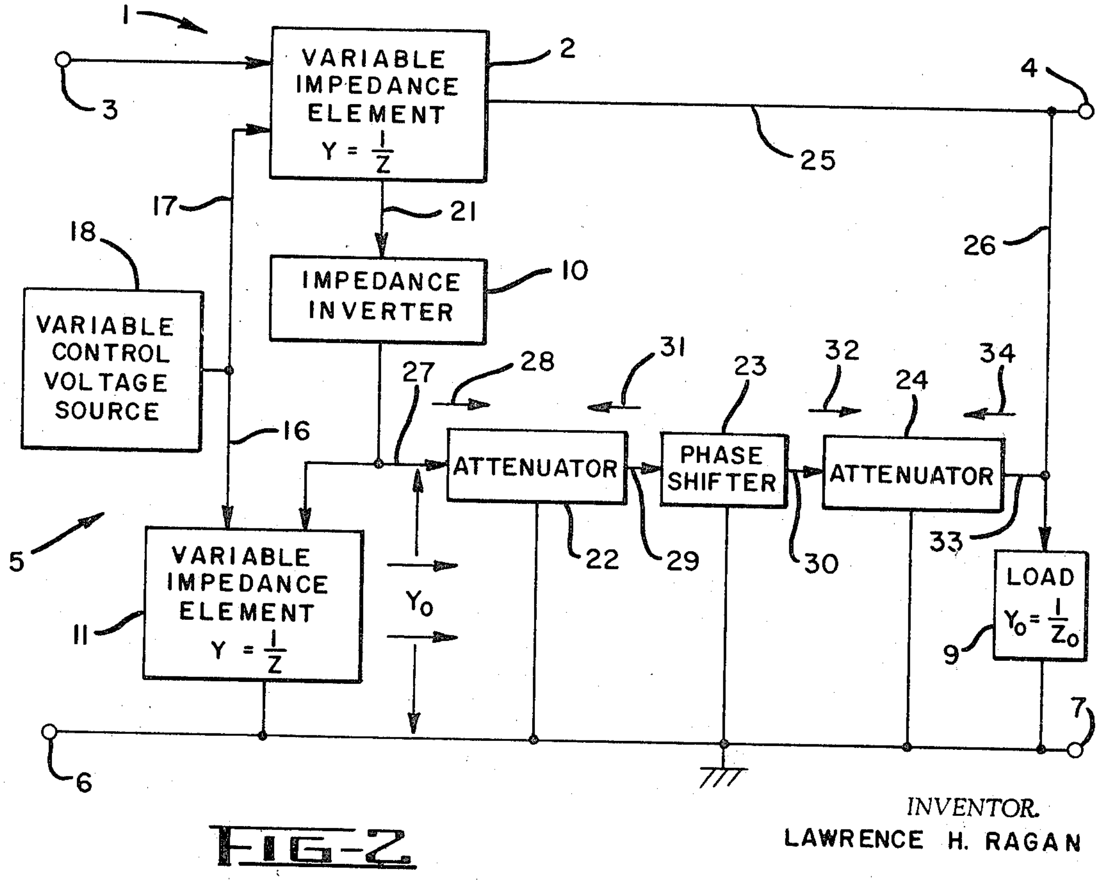
FIG. 2 is a schematic block diagram of a variable attenuator incorporating this invention.

The embodiment of this invention illustrated in FIG. 2 is similar to the variable attenuator of FIG. 1 except that the input signal may be applied to inverter 10 through a second output 21 of element 2 and that the output of inverter 10 is serially connected through a first attenuator 22, a phase shifter 23, and a second attenuator 24 to the side of load 9 connected to terminal 4. The load 12 of FIG. 1 is incorporated in attenuator 22. Attenuators 22 and 24 and phase shifter 23 are all connected to the ground reference potential.

Phase shifter 23 adjusts the phase of a signal current coupled therethrough to load 9 to be 180° out-of-phase with a signal current coupled to load 9 through element 2 and lines 25 and 26. Phase shifter 23 may, by way of example, be a length of coaxial transmission line having a characteristic impedance $Z_0$. Thus, if impedance inverter 10 is a quarter-wavelength transmission line and other elements of the network and the interconnecting leads do not introduce a phase shift in signal currents passed thereby, phase shifter 23 may be a length of transmission line that is a quarter wavelength long at the operating frequency of the attenuator.

The first attenuator 22 has an impedance $Z_0$ between line 27 and ground (in the direction of arrow 28) that is equal to the predetermined impedance of load 9. Attenuator 22 therefore provides the proper termination or load for inverter 10 such that the input impedance of the network (between input terminals 3 and 6) is constant as shown in the aforementioned Van Sandwyk application and as discussed more fully hereinafter. In order to properly match attenuators 22 and 24 to phase shifter 23, the impedances of attenuators 22 and 24 between lines 29 and 30, respectively, and ground (in the direction of arrows 31 and 32, respectively) are equal to the characteristic impedance $Z_0'$ of the phase shifter 23. The impedance of attenuator 24 between line 33 and ground (in the direction of arrow 34) is much greater than the predetermined impedance $Z_0$ so that connection of bypass circuit 5 to load 9 does not adversely affect the impedance thereof.

Consider for example that inverter 10 and phase shifter 23 are each quarter wavelength sections of coaxial transmission line and that other components of the network do not affect the phase of signals passed thereby. In operation, an input signal is applied between input terminals 3 and 6. When it is desired to pass the input signal with minimum attenuation, control signals on lines 16 and 17 are adjusted to bias elements 2 and 11 to have a minimum impedance. The value of element 11 is therefore very low. Thus, the combined impedance of element 11 and the load provided by attenuator 22 (the impedance $Z_0$ between line 27 and ground) that is reflected back through inverter 10 to line 21 is a large impedance. Since the impedance of element 2 is very small, it appears to an input signal that an open circuit exists between line 21 and terminal 6 so that the input signal is effectively blocked from line 21 and is passed by element 2 to output terminal 4 without attenuation.

When it is desirable to provide maximum attenuation of an input signal, control signals on lines 16 and 17 are adjusted to bias elements 2 and 11 to have maximum impedances much greater than the predetermined impedance $Z_0$. The value of element 11 is therefore very large. Thus, the impedance reflected back through inverter 10 to line 21 is approximately equal to the predetermined impedance $Z_0$ provided by attenuator 22 between line 27 and ground. Since the value of element 2 is much larger than the transformed impedance $Z_0$, the input signal current is passed on line 21 and is delayed by inverter 10 such that the signal current on line 27 lags the input signal current applied to terminal 3 by 90°. A portion of the signal current on line 27 is shunted to ground by attenuator 22. The remainder of the signal current on line 27 is delayed by phase shifter 23 to provide an output current on line 33 that is 180° out-of-phase with the input signal current applied to terminal 3. Any signal current passed by element 2 is assumed to be in phase with the input signal current. Thus, the output current of the bypass circuit or line 33 and signal currents passed by element 2 tend to cancel in load 9 since they are 180° out-of-phase.

In order to provide maximum attenuation of the input signal current (elements 2 and 11 are adjusted to provide maximum attenuation), the portion of the input signal current passed by inverter 10, element 11, attenuators 22 and 24, and phase shifter 23 to load 9 is made equal to the portion of the input signal current passed by element 2 to load 9. Stated differently, and considering that line 33 is open circuited and connected to ground through an identical load 9' (not shown), the network is designed such that the signal current applied to load 9 is equal in magnitude to and 180° out-of-phase with the signal current applied to load 9' when elements 2 and 11 are adjusted to provide maximum attenuation.

The constant value of the input impedance of the network (between input terminals 3 and 6) over changes in the values of elements 2 and 11 and the attenuation of the network is verified by the following analysis of the input admittance (the reciprocal of the input impedance) of the network. The input admittance ($Y_{in}=1/Z_{in}$) between input terminals 3 and 6 is $$Y_{in}=Y_1+Y_2 \qquad (1)$$

where $Y_1$ is the admittance of the series circuit including element 2 and load 9, and $Y_2$ is the admittance of bypass circuit 5.

The admittance $Y_1$ is $$Y_1=\frac{YY_0}{Y+Y_0} \qquad (2)$$

where Y is the admittance of element 2, $Y_0=1/Z_0$, and $Z_0$ is the predetermined impedance of load 9.

As mentioned previously, the impedance between line 27 and ground, presented by attenuator 22 and the circuit to the right thereof in FIG. 2, is equal to the predetermined impedance $Z_0$. Thus, element 11 is effectively connected in parallel with an attenuator having an impedance $Z_0$ so that the admittance between the output of inverter 10 and ground is $Y+Y_0$. The admittance $Y_2$ of bypass circuit 5 between line 21 and terminal 6 is therefore $$Y_2=Y_0\left[\frac{(Y+Y_0)\cos\beta l+jY_0\sin\beta l}{Y_0\cos\beta l+j(Y+Y_0)\sin\beta l}\right]$$
$$=\frac{Y_0^2}{Y+Y_0} \qquad (3)$$

where $Y_0=1/Z_0$ is the admittance between line 27 and ground presented by attenuator 22 and is the characteristic admittance of inverter 10, and Y is the admittance of element 11 $\beta=2\pi/\lambda$, $\lambda$ is wavelength, and $l=\lambda/4$.

Substituting Equations 2 and 3 in Equation 1, the input admittance $Y_{in}$ of the network is $$Y_{in}=\frac{YY_0}{Y+Y_0}+\frac{Y_0^2}{Y+Y_0}$$
$$=Y_0 \qquad (4)$$

and therefore $$Z_{in}=Z_0 \qquad (5)$$

Thus, it is seen that the input impedance of the network is a constant equal to the predetermined impedance $Z_0$, is independent of the impedances of elements 2 and 11, and is independent of the circuit to the right of attenuator 22 in FIG. 2.

Figures 3, 4:
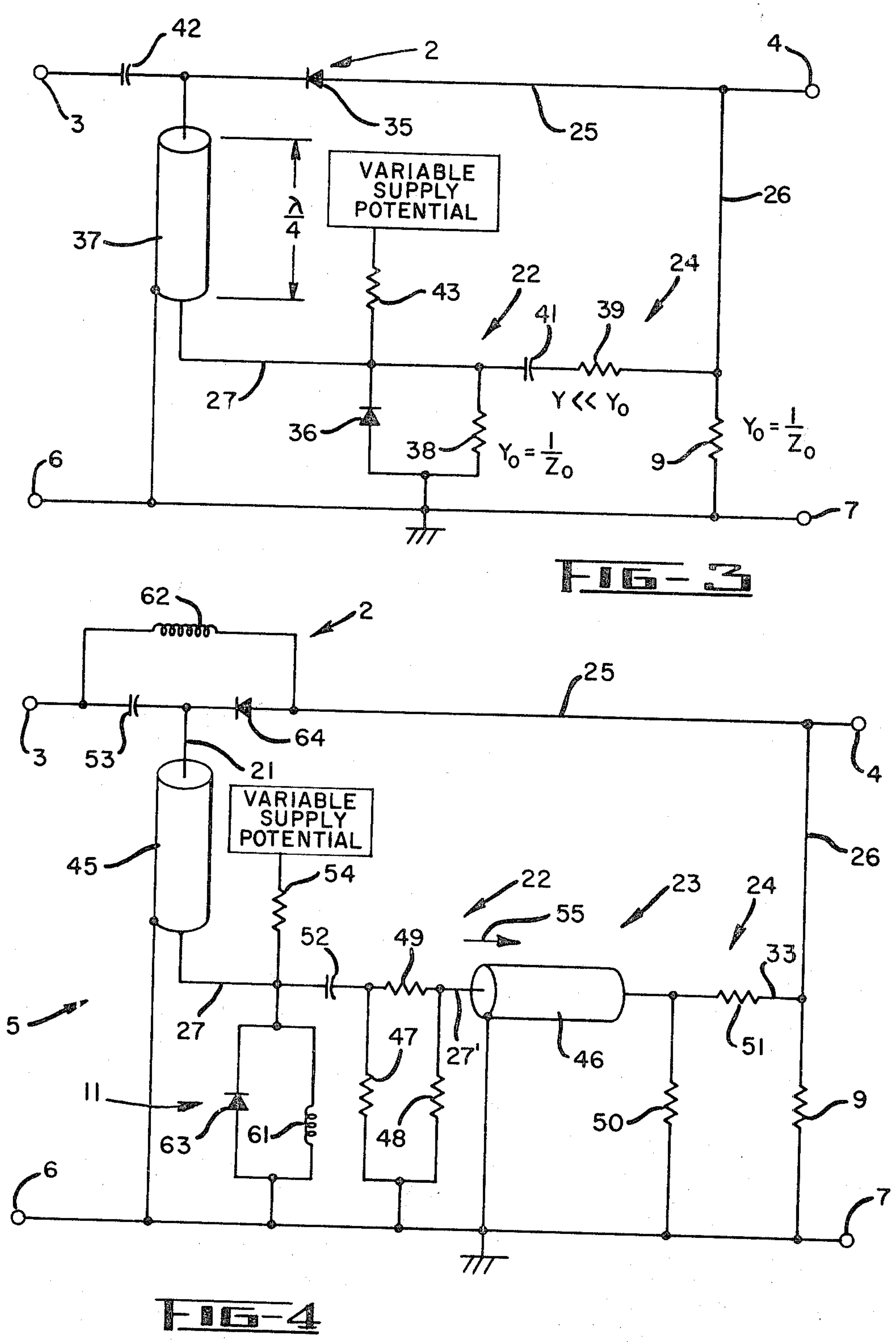
FIG. 3 is a circuit diagram of a first embodiment of the variable attenuator illustrated in FIG. 2.
FIG. 4 is a circuit diagram of a second embodiment of the variable attenuator illustrated in FIG. 2.

Referring to the embodiment of this invention illustrated in FIG. 3, elements 2 and 11 comprise varactor diodes 35 and 36, respectively. Since the impedances of the varactor diodes are capactive reactances, diode 35 introduces a 90° phase shift in signal current passed thereby such that the signal current on line 25 leads the input signal current applied to terminal 3 by 90°. Inverter 10 is a quarter wavelength section 37 of coaxial transmission line which delays signal current applied thereto such that signal current on line 27 lag the input signal current applied to terminal 3 by 90°. Since the signal current on lines 25 and 27 are already 180° out-of-phase (the signal current on line 25 leads the input signal current by +90° whereas the signal current on line 27 lags the input signal current by −90°), phase shifter 23 reduces to a transmission line section of zero length and providing 0° phase shift. Attenuator 22 therefore is a single resistor 38 having a resistance $R_0$ equal to the resistance $R_0$ of load 9 which is also a resistor. Similarly, attenuator 24 is a single resistor 39 having a resistance much larger than the resistance $R_0$ of load resistor 9. DC blocking capacitors 41 and 42 and resistor 43 are associated with the variable supply potential which comprises the variable control voltage source 18 for biasing the varactor diodes. Since DC blocking capacitors 41 and 42 are effectively short circuits at the operating frequency of the attenuator, the capacitors do not alter the phase of the input signal currents passed thereby. The operation of the circuit of FIG. 3 is the same as that of FIG. 2 except that a separate phase shifter 23 is not required to provide the requisite 180° phase differential between the signal currents applied to load 9.

Another embodiment of this invention for providing even greater attenuation is illustrated in FIG. 4 wherein elements 2 and 11 each comprise a parallel resonant circuit including an inductor and a varactor diode. Inverter 10 comprises a quarter wavelength section 45 of coaxial transmission line having a characteristic impedance $Z_0$ equal to the predetermined impedance. Phase shifter 23 comprises a quarter wavelength section 46 of coaxial transmission line having a characteristic impedance $Z_0'$. It is not necessary that the characteristic impedance $Z_0$ of line 45 be equal to the characteristic impedance $Z_0'$ of line 46. Attenuator 22 comprises a resistor 47 connected between the center conductor of line 45 and ground and having a resistance $R_0$ that is equal to the resistance $R_0$ of load resistor 9; a resistor 48 connected between the center conductor of line 46 and ground and having a resistance $R_0'$; and, a resistor 49 connecting the center conductors of lines 45 and 46 and having a resistance much greater than the resistances of resistors 47 and 48. Attenuator 24 comprises a resistor 50 connected between the center conductor of transmission line 46 and ground and having a resistance $R_0'$ and a resistor 51 having a resistance much greater than the resistances of resistor 50 and load resistor 9. DC blocking capacitors 52 and 53 and resistor 54 operate in conjunction with the variable supply potential to vary the reactances of the varactor diodes and thus the impedances of the resonant circuits. The operation of the circuit in FIG. 4 is similar to that of FIGS. 2 and 3 except that the requisite 180° phase differential between the phases of the signal currents applied on lines 26 and 33 to load 9 is provided by transmission lines 45 and 46.

If the characteristic impedances $Z_0$ and $Z_0'$ of transmission lines 45 and 46, respectively, are made equal ($Z_0'=Z_0=R_0=R_0'$), attenuator 22 may comprise a single resistor 47 (resistor 48 is replaced by an open circuit and resistor 49 is replaced by a short circuit). Resistor 47 may also be replaced by an open circuit since the resistance $R_0=R_0'$ of resistor 50 is transformed by quarter wavelength transformer-impedance inverter 46 to the same resistance $R_0$ between line 27' and ground (looking into transmission line 46 in the direction of arrow 55) according to the relationship $Z_0^2=Z_1Z_2=R_0R_0=R_0^2$ where $Z_0$ is the characteristic impedance of transmission line 46, $Z_1=R_0$ is the impedance of resistor 50 and $Z_2=R_0$ is the impedance between line 27 and ground. Resistor 51 is selected such that the output of the bypass circuit on line 33 is equal to the signal on line 26 when the varactor diodes are biased to provide maximum impedance. The operation of these modified circuits is the same as that of the circuit of FIG. 4. By way of example, a modified form of the variable attenuator shown in FIG. 4 was built and tested has had the following components and operation.

Inductor 61—0.22 μh.
Inductor 62—0.22 μh.

Varactor diodes 63 and 64—PC-124
Capacitor 52—680 pf.
Capacitor 53—680 pf.
Resistor (load) 9—50Ω,
Resistor 47—∞
Resistor 48—∞
Resistor 49—0
Resistor 50—51Ω
Resistor 51—1300Ω
Coaxial transmission lines 45 and 46:
  Length—14.75 inches
  Characteristic impedance—50Ω
Control voltage—0–28 v.
Design frequency $f_0$—131 mc.
Bandwidth—10 kc.
Attenuation:
  Minimum—0.75 db
  Maximum—50 db
Input impedance variation (over the range of attenuation)—±2Ω

By way of comparison, the comparable Van Sandwyk variable attenuator (the circuit of FIG. 4 wherein resistors 48, 49, 50, and 51 are each replaced by an open circuit) had a maximum attenuation of 28 db. The maximum attenuation of the Van Sandwyk attenuator and the above defined attenuator were increased to 48 db and 65 db, respectively, by employing inductor elements having higher Q.

Although this invention is described in relation to preferred embodiments thereof, variations and modifications will be apparent to those skilled in the art. The scope and breadth of this invention is, therefore, defined by the following claims rather than by the above detailed description of a preferred embodiment thereof.

What is claimed is:

1. A variable attenuator having a substantially constant input impedance equal to a predetermined impedance, said attenuator comprising
- a first variable impedance element having an input for receiving an input signal and having an output,
- a first load having an impedance equal to the predetermined impedance, having a first terminal connected to the output of said first element and having a second terminal connected to a reference potential,
- a first transmission line impedance inverter having an input electrically connected to the input of said first element, having an output, having a length equal to a quarter wavelength at a predetermined frequency and having a characteristic impedance equal to the predetermined impedance,
- a second variable impedance element having a first terminal connected to the output of said inverter and having a second terminal connected to the reference potential, each of said elements having substantially identical impedance characteristics,
- a first attenuator network comprising
  - a first impedance having a first terminal connected to the first terminal of said load, having a second terminal, and having a value substantially greater than the value of the predetermined impedance, and
  - a second impedance having a first terminal connected to the reference potential, and having a second terminal,
- a second transmission line phase shifter having an input, having an output connected to the second terminals of said first and second impedances, having a length substantially equal to a quarter wavelength at the predetermined frequency and having a characteristic impedance equal to the value of said second impedance,
  - said first impedance having a value substantially greater than the characteristic impedance of said second line, a second attenuator network comprising a third impedance connected between the output of said inverter and the input of said phase shifter and having a value substantially greater than the values of the predetermined impedance and the characteristic impedance of said second line, a fourth impedance connected between the output of said inverter and the reference potential and having a value equal to the predetermined impedance, and a fifth impedance connected between the input of said phase shifter and the reference potential and having a value equal to the characteristic impedance of said second line, said phase shifter adjusting the phase of signals passed thereby such that the signal passed to said load from the first terminal of said first impedance is substantially 180° out-of-phase with the signal passed to said load from the output of said first element, and means for varying the values of said elements while maintaining their impedances equal for varying the attenuation of the input signal applied to the input of said first element.

2. The variable attenuator according to claim 1 wherein the characterisitc impedance of said second transmission line is equal to the predeterminad impedance.

3. The variable attenuator according to claim 1 wherein each of said elements comprises the parallel combination of an inductor and a varactor diode and wherein said means for varying the value of said elements comprises a controlled source for generating a variable control voltage and means for simultaneously applying the control voltage to said varactor diodes for simultaneously providing equal variation in the impedances thereof while maintaining their impedances substantially equal for varying the portion of the input signal passed by said bypass circuit.

References Cited

UNITED STATES PATENTS

| | | | |
|---|---|---|---|
| 2,630,491 | 3/1953 | Waltz | 333—81 |
| 2,808,474 | 10/1957 | Maynard et al. | 330—145 |
| 3,093,802 | 6/1963 | Chow | 333—81 X |
| 3,136,963 | 6/1964 | Feldman et al. | 333—81 X |
| 3,412,348 | 11/1968 | Hull | 333—81 X |
| 3,416,101 | 12/1968 | Van Sandwyk | 333— 35 X |
| 2,138,996 | 12/1938 | Blumlein | 333—76 |
| 2,258,974 | 10/1941 | Dagnall | 333—8 X |
| 2,270,416 | 1/1942 | Cork et al. | 333—8 X |
| 2,396,708 | 3/1946 | Leeds | 333—22 X |
| 2,762,017 | 9/1956 | Bradburd et al. | 333 —9 |
| 2,861,245 | 11/1958 | Krause | 333—9 |
| 3,049,667 | 8/1962 | Broadhead et al. | 324—81 X |
| 3,110,004 | 11/1963 | Pope | 334—15 |
| 3,188,566 | 6/1945 | Bullene | 333—6 X |
| 3,217,275 | 11/1965 | Duncan et al. | 333—6 X |
| 3,293,552 | 12/1966 | Sichak et al. | 333—70 X |

FOREIGN PATENTS 817,962 8/1959 Great Britain.

OTHER REFERENCES

Cox, Russell: "Phasing Networks for Broadcast Arrays," Electronics, June 1944.

HERMAN KARL SAALBACH, Primary Examiner

W. H. PUNTER, Assistant Examiner

U.S. Cl. X.R.

333—7, 35, 81